United States Patent
Moulard

(10) Patent No.: US 11,509,286 B2
(45) Date of Patent: Nov. 22, 2022

(54) BAW RESONATOR WITH INCREASED QUALITY FACTOR

(71) Applicant: RF360 EUROPE GMBH, Munich (DE)

(72) Inventor: Gilles Moulard, Munich (DE)

(73) Assignee: RF360 Europe GmbH, Munich (DE)

( * ) Notice: Subject to any disclaimer, the term of this patent is extended or adjusted under 35 U.S.C. 154(b) by 156 days.

(21) Appl. No.: 16/963,780

(22) PCT Filed: Jan. 21, 2019

(86) PCT No.: PCT/EP2019/051386
§ 371 (c)(1),
(2) Date: Jul. 21, 2020

(87) PCT Pub. No.: WO2019/145258
PCT Pub. Date: Aug. 1, 2019

(65) Prior Publication Data
US 2020/0350888 A1    Nov. 5, 2020

(30) Foreign Application Priority Data

Jan. 23, 2018 (DE) ...................... 10 2018 101 442.2

(51) Int. Cl.
*H03H 9/13* (2006.01)
*H03H 3/02* (2006.01)
*H03H 9/17* (2006.01)
*H03H 9/56* (2006.01)

(52) U.S. Cl.
CPC .............. *H03H 9/132* (2013.01); *H03H 3/02* (2013.01); *H03H 9/131* (2013.01); *H03H 9/173* (2013.01); *H03H 9/175* (2013.01); *H03H 9/568* (2013.01)

(58) Field of Classification Search
CPC .......... H03H 9/132; H03H 3/02; H03H 9/131; H03H 9/173; H03H 9/175; H03H 9/568
USPC ........................................................ 333/192
See application file for complete search history.

(56) References Cited

U.S. PATENT DOCUMENTS

| 9,571,063 B2 | 2/2017 | Burak et al. |
| 11,152,909 B2* | 10/2021 | Bradley ................. H03H 9/131 |
| 2006/0071736 A1 | 4/2006 | Ruby et al. |
| 2010/0327697 A1 | 12/2010 | Choy et al. |
| 2012/0074811 A1 | 3/2012 | Pang et al. |
| 2014/0118087 A1 | 5/2014 | Burak et al. |
| 2016/0126930 A1 | 5/2016 | Zou et al. |
| 2017/0054430 A1 | 2/2017 | Fattinger et al. |
| 2019/0356301 A1* | 11/2019 | Yoon ................. H03H 9/02047 |
| 2020/0327697 A1 | 12/2020 | Choy et al. |

OTHER PUBLICATIONS

International Search Report and Written Opinion dated May 6, 2019 corresponding to Application No. PCT/EP2019/051386.

* cited by examiner

*Primary Examiner* — Hafizur Rahman
(74) *Attorney, Agent, or Firm* — Patterson & Sheridan, LLP

(57) ABSTRACT

A BAW resonator comprises a center area (CA), an underlap region (UL) surrounding the center area having a thickness smaller than the thickness $d_C$ of the center region and a frame region (FR), surrounding the underlap region having thickness $d_F$ greater than $d_C$.

17 Claims, 4 Drawing Sheets a)

b)

c)

d)

e)

BAW RESONATOR WITH INCREASED QUALITY FACTOR

CROSS-REFERENCE TO RELATED APPLICATIONS

Figure 1:
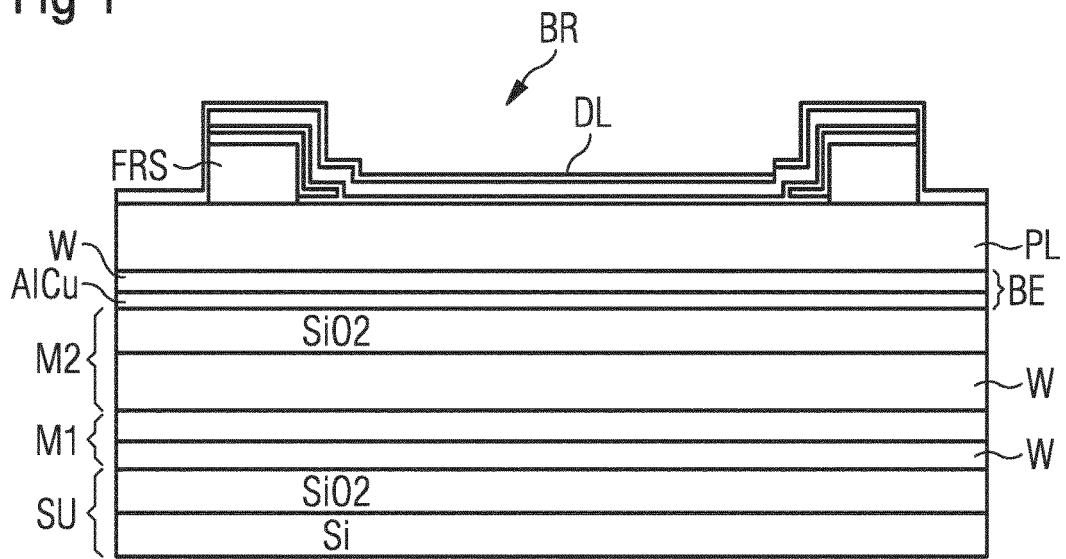

This application is a national stage application under 35 U.S.C. 371 of PCT/EP2019/051386, filed Jan. 21, 2019, which claims the benefit of German Application No. 10 2018 101 442.2, filed Jan. 23, 2018, both of which are incorporated herein by reference in their entireties.

The present invention refers to BAW resonators, e.g. for RF filters, having improved acoustic and electric properties.

BAW resonators (BAW=bulk acoustic wave) can be used to build bandpass or band rejection filters for RF applications, e.g. wireless communication devices. Such devices can use filters comprising such resonators. Usually, wireless communication devices have an energy source with limited energy resources and power saving circuits are preferred.

BAW resonators have an active region comprising a sandwich construction with a piezoelectric material between a bottom electrode and a top electrode. Due to the piezoelectric effect such resonators convert between RF signals and acoustic waves if an RF signal is applied to the resonator electrodes.

BAW resonators are known from U.S. Pat. No. 9,571,063 B2 and from U.S. Pat. No. 9,219,464 B2.

One way to keep the acoustic energy within the layer stack of the active region is to use acoustic mirrors. An acoustic Bragg mirror is arranged between the sandwich construction of the resonator and the substrate onto which the layer stack is deposited. On top of the sandwich the leap of acoustic impedance from the top resonator layer to environmental air is sufficient for completely reflecting acoustic waves back into the resonator. Such resonators are classified as SMR type BAW resonators (solidly mounted resonator).

An acoustic Bragg mirror comprises at least one pair of mirror layers with alternating high and low acoustic impedance. In current BAW resonators mirror layers are chosen to provide an impedance leap as high as possible. Tungsten has been a good choice for a high impedance mirror layer while the availability and relatively low impedance of silicon oxide makes $SiO_2$ a preferred low impedance mirror layer.

Another type of BAW resonators use an air gap below the acoustic active region to provide sufficient acoustic reflection at the interface between the layer stack of the active region and the air gap. The air gap is formed by a recess in the substrate below the layer stack. The recess is suspended by a thin membrane to provide the air gap. The layer stack is arranged on top of the membrane. Such a BAW resonator is called an FBAR (thin film bulk acoustic resonator).

It is an object of the invention to provide a BAW resonator that has a further increased quality factor Q.

These and other objects are solved by a BAW resonator according to claim 1.

Further embodiments and advantageous variations can be taken from sub-claims.

The BAW resonator comprises as usual a substrate onto which a layer stack is arranged comprising a sandwich. The latter is formed of a bottom electrode, a piezoelectric layer and a top electrode.

The sandwich comprises is laterally structured to comprise a center area having a thickness $d_C$ wherein the three layers of the sandwich overlap each other, an underlap region having a thickness $d_U$ surrounding the center area and a frame region having a thickness $d_F$ greater than $d_C$ surrounding the underlap region.

It has been found that excitation of spurious modes that usually lead to spurious signal and energy loss of the BAW resonator can be minimized or suppressed by reducing the thickness $d_U$ of the underlap region to be smaller than the thickness $d_C$ of the center region.

In BAW resonators spurious mode are coupling at frequencies below the device's fundamental resonance. An effective minimizing can be achieved by a proper dimensioning of the underlap.

As a further positive effect such an underlap region increases the Q factor of the BAW resonator.

As top layer a dielectric layer may cover the whole surface of the BAW resonator. This layer can function as a trimming layer to set the exact resonance frequency and to compensate manufacturing tolerances. Further, the trimming layer can be used for trimming series and parallel resonators as well that are mutually shifted slightly in frequency as it is necessary for forming a ladder type filter structure the BAW resonator is usually used.

One way to reduce the thickness $d_U$ of the underlap region relative to the thickness $d_C$ of the center region is to reduce the thickness of the dielectric layer. Thereby the thickness of the layer stack can be kept uniform across the center region and the underlap region as well.

To achieve enough suppression of spurious mode an effective thickness reduction in the underlap region is required. However, even if the underlap region improves the Q factor of the BAW resonator a too high thickness reduction of the dielectric layer is not beneficial for the resonator performance. The reduced thickness of the dielectric layer in the underlap region requires a higher thickness thereof in the center region. If the dielectric layer is a SiN layer as normally is the case when used for trimming purposes a higher thickness of the dielectric SiN layer reduces the Q factor of the BAW resonator due to the quality of the SiN layer itself. Moreover a higher thickness in the center region results in another energy distribution within the layer stack. Then, more energy is stored within the top electrode and thus higher losses result relative to a distribution where the energy is concentrated within the piezoelectric layer. This is due to material properties of the top electrode comprising a more lossy material.

According to a preferred embodiment the thickness reduction of $d_U$ is mainly based on a thickness reduction of top electrode or bottom electrode. When doing so a uniform layer thickness of the dielectric can be set with an optimized not too high thickness in the center region.

In an embodiment one of bottom and top electrode comprises a first sub-layer of an AlCu and a second sub-layer of W. Then it is possible to reduce the thickness of one of these sub-layers of bottom or top electrode in the underlap region.

Such a thickness reduction can be done without negative influence onto the Q factor.

A preferred use of BAW resonators is for RF filter purposes. A filter comprises series resonators and shunt resonators arranged in ladder type circuit. Each of the series and shunt resonators may be embodied as the BAW resonator with an underlap region as described above.

The trimming layer may be formed from a SiN layer. Within a single BAW resonator the trimming layer may have a uniform thickness. According to an embodiment the preferred thickness is about 60 nm. However the preferred and optimized thickness of the trimming layer may be set dependent on the resonance frequency of a respective resonator.

According to a further embodiment the thickness reduction of the SiN or dielectric layer in the underlap region is about 25 nm. For suppressing specific spurious modes relative to the center frequency of the resonator an optimal effect may yielded with another amount of thickness reduction. This is true for those embodiments where the thickness reduction in the underlap region is made in another layer like the Al Cu layer for example.

The other dimensions of the underlap region that is the dimensions of the trench like structure along the margin region of the resonator have to be optimized with respect to the dimensions of the whole resonator and the center frequency thereof. For example, the underlap region may have a constant width along its whole perimeter, the width being about 0.2 µm to 10.0 µm that may be dependent on the respective resonance frequency of the BAW resonator.

Besides the mentioned features a BAW resonator may be embodied in other advantageous configurations that do not directly counteract with the proposed improvements.

A BAW resonator may comprise a structure denoted as an outer-flap that can be incorporated into the device. The outer-flap can be formed from the dielectric layer or another additional layer and extends laterally outwards and away from the center area and distant to top surface of the resonator separated by a gap. The outer-flap is supported by the frame-region. The outer-flap is provided for counterbalancing oscillations of the center area.

A dielectric anchor of the outer-flap attaches to the resonator device surface outside the active resonator area or as close to the edge of the frame region as the process allows and extends for a finite length forming a feature denoted as an outer-lap.

Moreover, the outer-lap may include an angle with the top surface of the resonator which is different from 0°. Hence the outer-flap may have a slant or stand up-right or, in an extreme case may extend with a slant inwardly towards the center region.

A feature denoted as a trench, meaning a trench in the dielectric layer, outer-lap, and optional outer-lap layers down to the piezoelectric, can be formed during patterning the dielectric layer for forming the features mentioned above. The lateral dimension the layer stack, its surface regions and the dielectric extensions can be tuned to further improve device Q.

In the following the invention will be explained in more detail with reference to specific embodiments and the accompanying figures. The figures are schematically only and are not drawn to scale. For better understanding some detail may be depicted in enlarged form.

Figure 2:
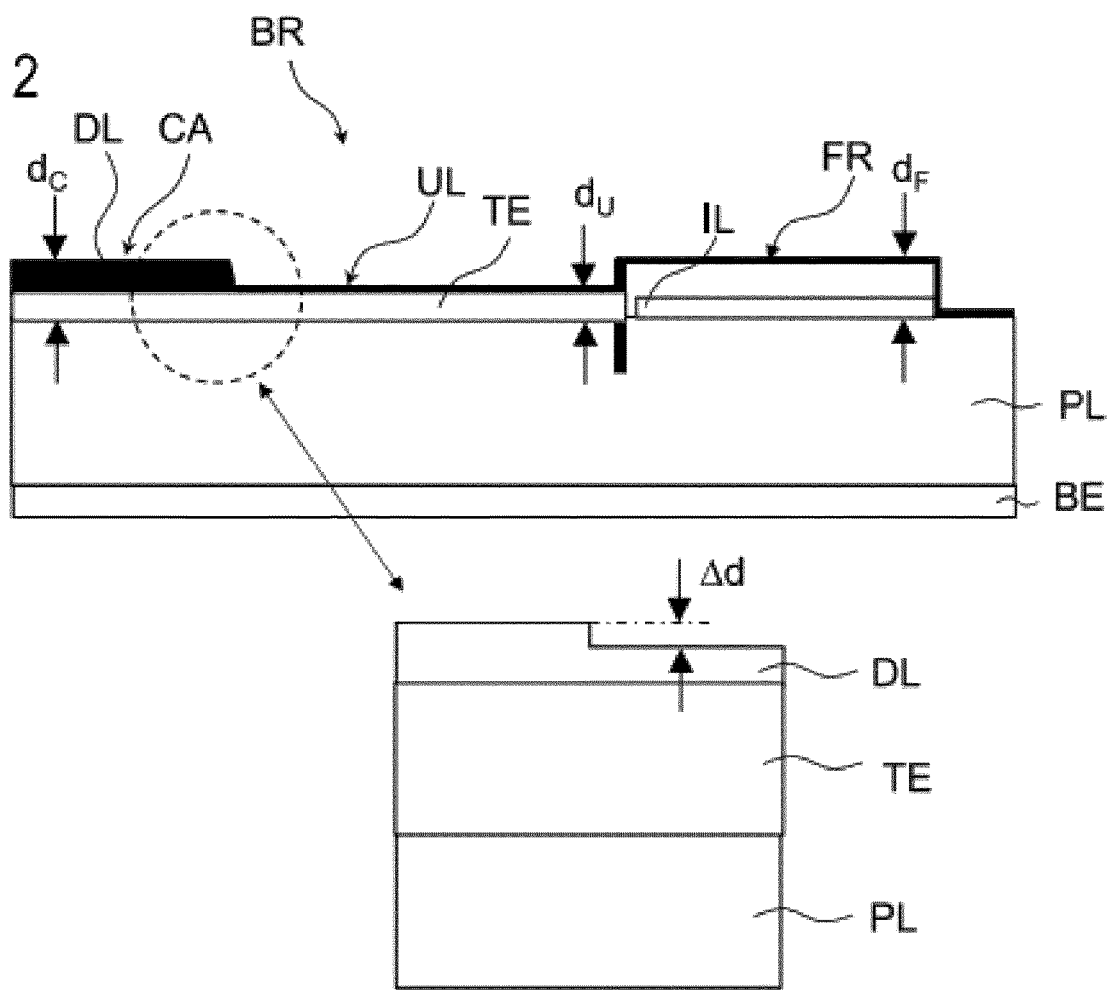
Figure 3:
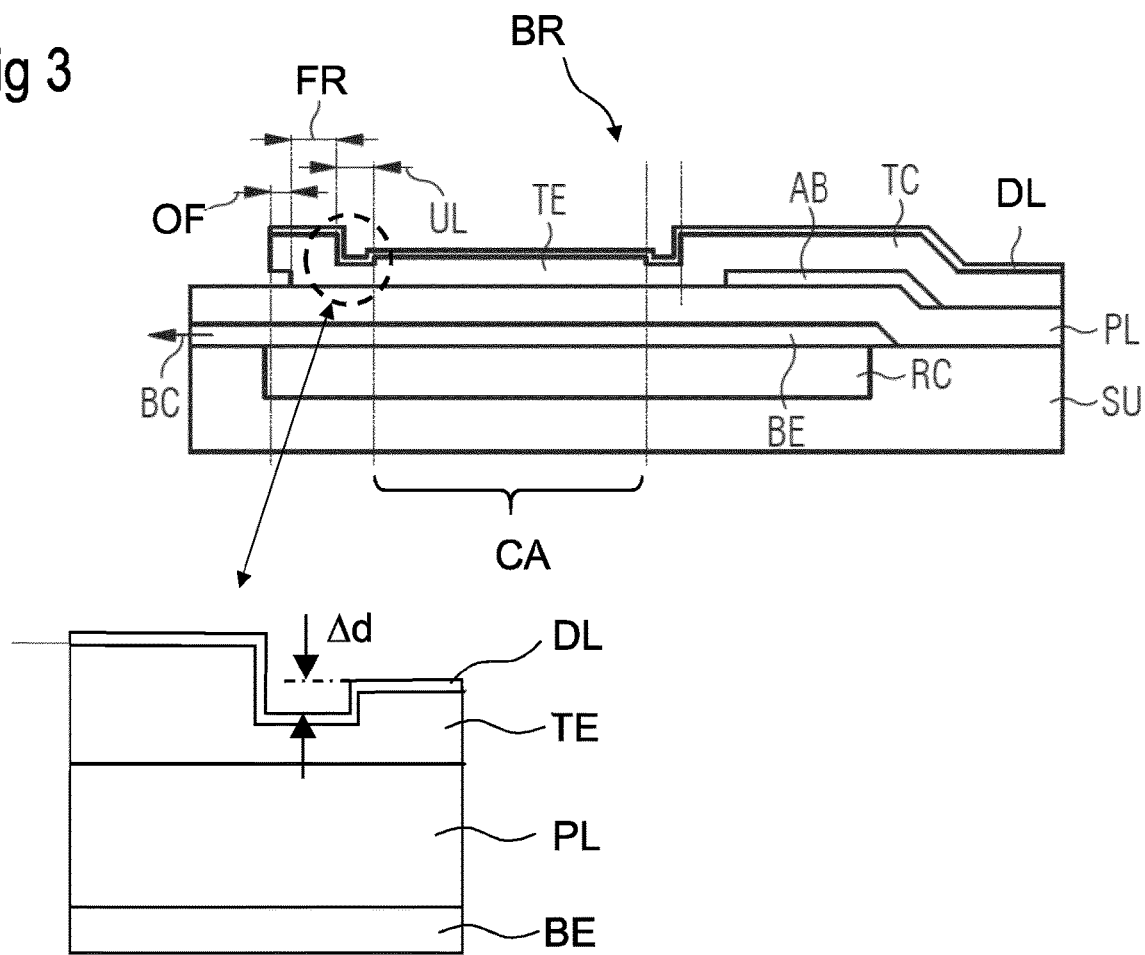
Figure 4:
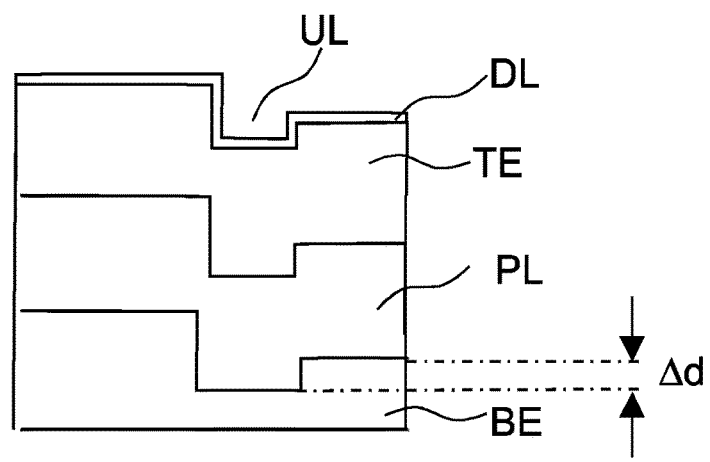
Figure 5:
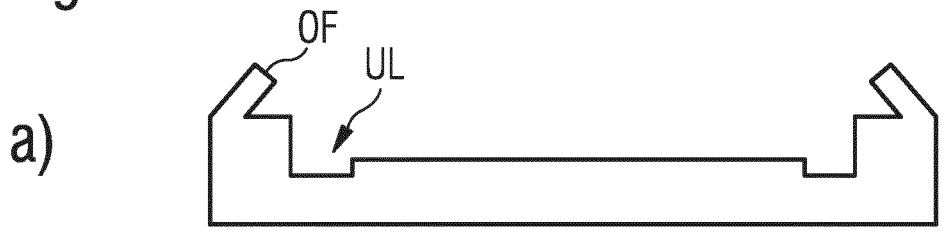
Figure 5:
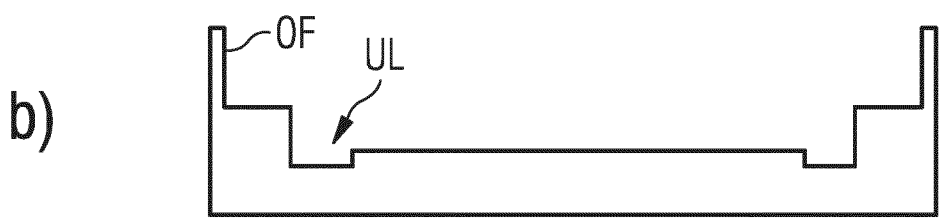
Figure 5:
Figure 5:
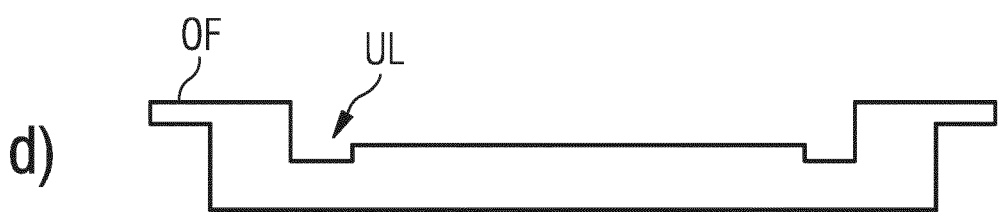
Figure 5:
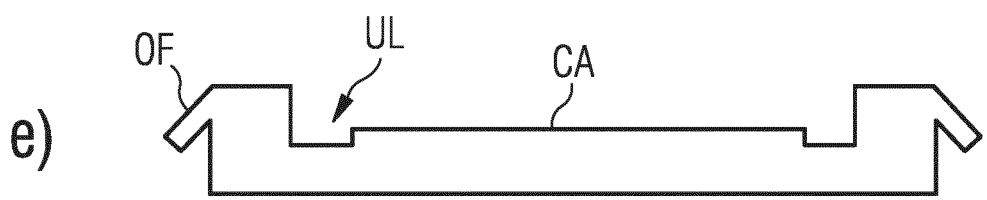
Figure 6:
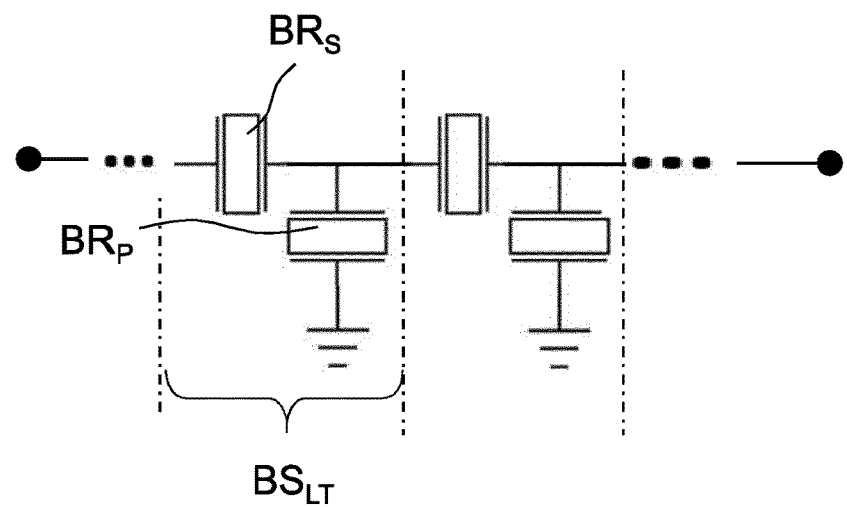
Figure 7:
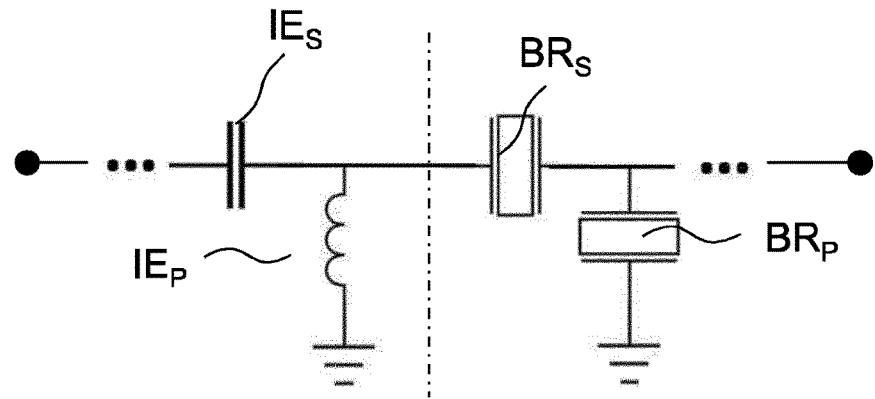
Figure 8:
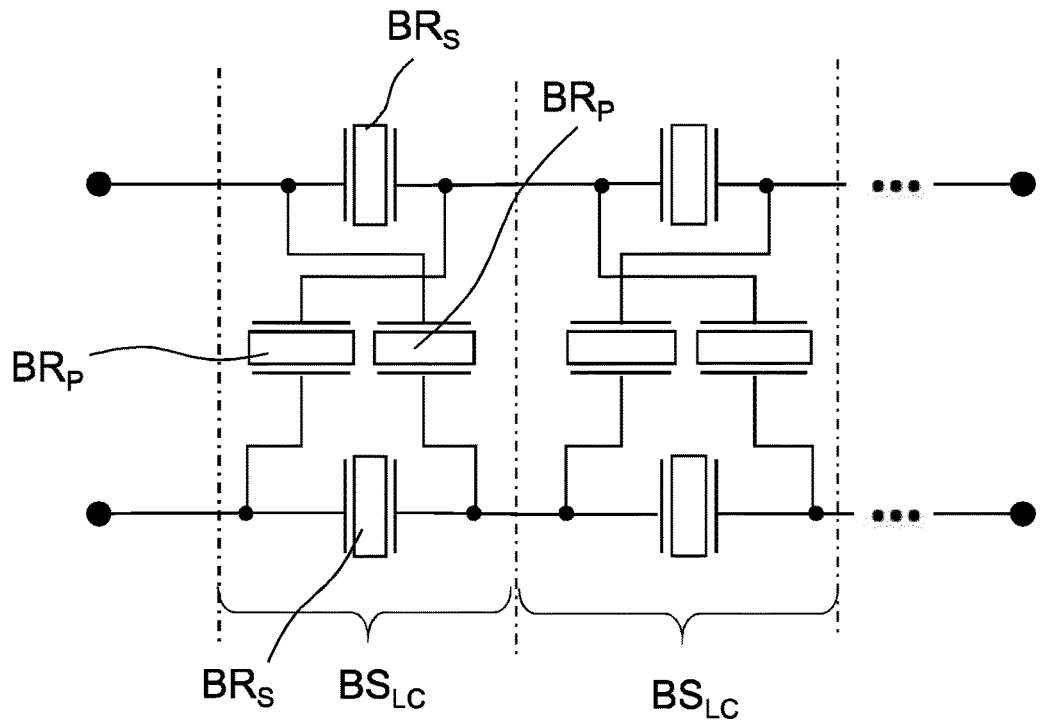

FIG. 1 shows a BAW resonator in a cross sectional view,
FIG. 2 shows a BAW resonator with an underlap formed in a top dielectric layer,
FIG. 3 shows a BAW resonator with an underlap formed in a top electrode layer,
FIG. 4 shows a BAW resonator with an underlap formed in a bottom electrode layer,
FIG. 5a to 5e show cross-sections through the top portion of a BAW resonator with an underlap and various possible embodiments of outer-flap structures,
FIG. 6 shows a ladder type arrangement of BAW resonators forming a filter circuit,
FIG. 7 shows a ladder type arrangement of BAW resonators and passive LC elements forming a filter circuit,
FIG. 8 shows a lattice type arrangement of BAW resonators forming a filter circuit. BAW resonators and passive LC elements forming a filter circuit FIG. 1 shows a schematic cross-section through a BAW resonator having some additional features. An improved resonator of the invention is based on this conventional structure.

The layer stack of the resonator is formed on a substrate SU of e.g. Si. Any other suitable rigid material can be used too. On top of the Si body a layer of $SiO_2$ may be formed for isolation purpose.

Next an acoustic Bragg mirror is formed and structured on the substrate SU from two mirrors M1, M2 that is from two pairs of mirror layers. In the Bragg mirror, high impedance layers and low impedance layers are alternating. The mirror layers in the two mirrors may be slightly in thickness to create different desired reflection bands. High impedance layers layer may comprise W and low impedance layers may comprise $SiO_2$.

Next the bottom electrode BE is formed from a relatively thin AlCu layer and a thicker W layer. Thereon a piezoelectric layer PL of e.g. AlN or AlScN is formed. The thickness thereof is set to about half the wavelength of the desired resonance frequency.

All the above layers in the stack are continuous layers of a respective area slightly extending the later active resonator area.

On top of the piezoelectric layer PL a frame structure FRS of e.g. $SiO_2$ is formed that surrounds the later center area CA of the resonator. The thickness of the frame structure makes the surface of the frame region having a higher level than the surrounding areas.

Above the center area CA and the frame structure FR a stack of layers form the top electrode TE and the top dielectric layer DL.

Above the frame structure FRS and extending over a small margin of the surface enclosed by the frame structure a thin layer of a mass loading material is deposited and structured. The dielectric SiN may cover the entire surface of resonator and the adjacent top surface of piezoelectric layer PL.

Above the resonator is a vacuum or an ambient atmosphere the resonator is working in.

FIG. 2 shows an embodiment of BAW resonator BR as a cut-out in a simplified depiction. Surrounding the center area CA and following the total perimeter thereof an underlap UL is formed wherein the layer stack of top electrode TE and piezoelectric layer PL has a thickness $d_U$ that is reduced by a value $\Delta d$ relative to the thickness $d_C$ in the center area CA. A frame region FR surrounds the underlap region UL along the total perimeter thereof. The frame region is formed from an intermediate dielectric layer IL e.g. a $SiO_2$ layer structured as a frame. Further, it is possible to elevate the surface level in the frame region by enclosing an air gap under a bottom layer of the layer stack in the frame region. The thickness $d_F$ of the layer stack in the frame region FR is higher than the thickness $d_C$ in the center area CA. Alternatively or additionally as mentioned above the height level may be enhanced by an air gap or a cavity.

In this embodiment the reduced thickness $d_U$ of the layer stack in the underlap region UL is due to a reduced thickness of the top dielectric layer DL. In the cut-out depicted in the bottom part of FIG. 2 shows the step in the dielectric layer in more detail. As an exemplary example the resonance frequency of BAW resonator BR is centered within band 25. Then an optimized thickness of the dielectric layer DL in the center area CA can be set to be about 85 nm. An optimized underlap comprises a thickness reduction Δd of about 25 nm to leave a thickness of the dielectric layer DL in the underlap region UL of about 60 nm.

The width of the underlap region UL is constant within a single region but can be different between different regions along the perimeter. One can consider 3 perimeter regions: perimeter region without any electrode connection—perimeter region with bottom electrode connection—perimeter with top electrode connection. The width can be set to be about 0.2 μm to 8.0 μm.

For other embodiments and BAW resonators with differing resonance frequency optimized width of underlap region and height reduction Δd thereof can amount different values. However, an optimized remaining thickness of the dielectric layer DL in the underlap region is the same for all examples and is set to about 60 nm because the dielectric layer DL layer acts as a passivation layer and requires a minimum remaining thickness to avoid reliability issues.

A cross-sectional view through BAW resonator according to another embodiment is depicted in FIG. 1. In a substrate SU of silicon for example a recess RC is formed. The layer stack of the resonator is arranged above the recess RC and comprises in a sequence beginning at the bottom a bottom electrode BE, a piezoelectric layer PL and a top electrode TE. The bottom electrode BE covers the recess RC. In an underlap region UL, the thickness of the layer stack is reduced relative to the center area CA. A frame region surrounds the center area CA. At least part of the layer stack that may be selected from top electrode and dielectric layer DL forms an lateral extension called outer-flap OF that runs away from the center area in a distances above the surface of the of the piezoelectric layer.

In the underlap region UL the top electrode TE is thinner than in the center area CA. In an overlap region OL the top electrode TE is thicker than the active region AR. Here, the outer-flap OF is made of metal and extends outward from the center area CA. An acoustic bridge AB may be formed between top electrode TE and piezoelectric layer PL in the area of a top electrode connection TC. The top electrode connection TC connects the top electrode to another BAW resonator or a terminal of a filter.

On the left side of the figure the bottom electrode extends outwardly to form a bottom electrode connection BC.

The dielectric layer DL is applied over the top electrode TE in a constant thickness but does not cover the sides of the top electrode or the underside of the top electrode connection TC (air bridge). As can be seen in the cut-out at the bottom part of FIG. 3 the thickness of the top electrode is reduced by Δd in the underlap region UL.

According to the embodiment shown in FIG. 4 the thickness reduction Δd of the layer stack in the underlap region UL is made in the bottom electrode BE. The thickness of the remaining stack layers above are respectively constant over the whole area of the BAW resonator BR. This example may be embodied with a Bragg mirror as shown in FIG. 1 or with a layer stack suspended over a recess in the substrate SU as shown in FIG. 3.

FIG. 5a to 5e show cross-sections through the top portion of a BAW resonator with an underlap UL and various possible embodiments of outer-flap structures OF that may be formed at the BAW resonator for improving and forming the desired wave mode and for counterbalancing oscillations that mainly are generated in the center area CA.

The outer-flap structures OF may be formed from an extension of a top electrode layer at the edge of the frame structure FRS. Alternatively the outer-flap structures OF are formed from a dielectric layer mechanically fixed to the top electrode TE. Alternatively, the flap structures FL may be an extension of the top dielectric layer made of e.g. SiN. The outer-flap structures may surround the total resonator area. It is possible that the outer-flap structure is omitted in a termination area (not shown) where the top electrode is extended to provide an electrical connection to an adjacent element that may be another BAW resonator or any other circuit element.

For simplification FIG. 5 does not differentiate or depict different materials that are comprised in the shown cut-out. Hence the structure is depicted unitary though it is not a uniform material. The depicted structure comprises top electrode layer TE, the frame region FR and the top dielectric layer DL.

The outer-flap structure OF of FIG. 5A is a linear extension that is directed inwardly to the center area.

The flap structure OF of FIG. 5B is a linear extension that is runs upwardly.

FIG. 5C shows an outer-flap OF that is running outwardly to enclose an angle to the surface between 0 to 90 degrees.

According to FIG. 5E the outer-flap OF extends horizontally outwardly from the frame region FR.

The outer-flap OF of FIG. 5E extends outwardly but is inclined versus the surface.

It is possible that the flap structures are oriented in an angle with respect to the wave vector of a main mode of the resonator. The angle can be selected from 0°, 45°, 90° and 135°. In this case, when the angle is 45°, the flap structure points towards the top side. When the angle equals 135°, the flap structure points towards the bottom side. However, other angles are also possible. The angle can be, e.g., between 0° and 45° or between 45° and 90° or between 90° and 135° or between 135° and 180°.

FIGS. 6 to 8 show schematic block diagrams of circuits comprising a resonators that form RF filters. BAW resonators as described above may advantageously be used in these filter circuits.

FIG. 6 shows a ladder-type arrangement comprising series BAW resonators $SR_S$ and parallel BAW resonators $BR_P$ that may be formed according to the invention. In this embodiment a respective series BAW resonator $SR_S$ and an according parallel BAW resonator $BR_P$ form a basic section $BS_{LT}$ of the ladder-type arrangement. A ladder-type arrangement comprises a number of basic sections $BS_{LT}$ that can be circuited in series to achieve a desired filter function.

FIG. 7 shows a block diagram of a hybrid filter that is depicted with a minimum number of elements. A real circuit may comprise a higher number of such structures. In the left part of FIG. 7 a first partial circuit of the hybrid filter comprises a series impedance element $IE_S$ and a parallel impedance element $IE_P$. The series impedance element $IE_S$ can be embodied as a capacitor and the parallel impedance elements $IE_P$ can be embodied as a coil.

A second partial circuit shown in the right part of the figure comprises at least one series BAW resonator $BR_S$ and at least one parallel BAW resonator $BR_P$. Within the combined filter circuit first and second partial circuits as shown in FIGS. 6 and 7, can alternate or can be arranged in an arbitrary sequence. The exact design of such a hybrid filter can be optimized according to the requirements of the desired hybrid filter. Such an optimization can easily be done by a skilled worker by means of an optimizing computer program.

FIG. 8 shows a lattice-type arrangement of BAW resonators comprising series and parallel BAW resonators. In contrast to the ladder-type arrangement, the parallel BAW resonators $BR_P$ are arranged in parallel branches that interconnect two series signal lines with series BAW resonators $BR_S$. The parallel branches are circuited in a crossover arrangement such that the basic section of the lattice-type arrangement $BS_{LC}$ comprises a first and a second series BAW resonator $SR_S$ arranged in two different signal lines and two crossover circuited parallel branches with a respective parallel BAW resonator $SR_P$ arranged therein. A lattice-type filter may comprise a higher number of basic sections according to the filter requirements.

Two or more of the filter circuits as shown in FIGS. 6 to 8 may form combined filters like duplexers or multiplexers. The filters may be used in RF circuits as band pass, notch or edge filters. The filter circuits may be combined with other circuit elements not shown or mentioned but generally known from the art.

The invention has been explained by a limited number of examples only but is thus not restricted to these examples. The invention is defined by the scope of the claims and may deviate from the provided embodiments. Where possible, features shown in an embodiment may be applied to other embodiments shown in other figures despite being not explicitly shown or mentioned.

LIST OF REFERENCE SIGNS

AB air bridge
BC bottom electrode connection
BE bottom electrode
BR BAW resonator
$BR_P$ shunt resonator
$BR_S$ series resonator
BS basic section of a filter circuit
CA center area
DL dielectric layer
FR frame region
$IE_S$, $IE_P$ series and shunt impedance element
IL dielectric interlayer
M1, M2 single mirrors of Bragg mirror
OF outer-flap
OL overlap
PL piezoelectric layer
RC recess in substrate
SU substrate
TC top electrode connection
TE top electrode
UL underlap region
Δd thickness reduction in underlap region

The invention claimed is:

1. A bulk acoustic wave (BAW) resonator, comprising:
a substrate;
a sandwich, comprising:
  a bottom electrode;
  a piezoelectric layer; and
  a top electrode; and
dielectric layer covering a surface of the BAW resonator,
wherein the sandwich further comprises:
  a center area, wherein the bottom electrode, the piezoelectric layer, and the top electrode of the sandwich overlap each other;
  an underlap region surrounding the center area and having a thickness $d_U$ smaller than a thickness $d_C$ of the center area, wherein the bottom electrode has a thickness in the underlap region that is smaller than the thickness of the bottom electrode in the center area; and
  a frame region surrounding the underlap region and having a thickness $d_F$ greater than $d_C$.

2. The BAW resonator of claim 1, wherein the thickness $d_U$ being smaller than the thickness $d_C$ is mainly due to a reduced thickness of one or more of the bottom electrode or the top electrode.

3. The BAW resonator of claim 1, wherein one of the bottom electrode and the top electrode comprises a first sub-layer of aluminum copper and a second sub-layer of tungsten, and wherein the thickness of one of the first sub-layer or the second sub-layer is reduced in the underlap region.

4. The BAW resonator of claim 1, wherein the frame region is formed by a dielectric interlayer arranged between the top electrode and the piezoelectric layer.

5. The BAW resonator of claim 1, wherein the dielectric layer has a uniform thickness over a total surface of the BAW resonator.

6. The BAW resonator of claim 1, wherein the BAW resonator is arranged in ladder type circuit of series resonators and shunt resonators, each series and shunt resonator being embodied as the BAW resonator, and wherein the dielectric layer is a trimming layer.

7. The BAW resonator of claim 1, wherein the dielectric layer is a trimming layer formed of silicon nitride having a uniform thickness of about 60 nm.

8. The BAW resonator of claim 1, wherein a thickness of the top electrode is reduced in the underlap region relative to the center area by about 15 nm.

9. The BAW resonator of claim 1, wherein the underlap region has a width of about 0.2 μm to 8.0 μm.

10. A bulk acoustic wave (BAW) resonator, comprising:
a substrate;
a sandwich, comprising:
  a bottom electrode;
  a piezoelectric layer; and
  a top electrode; and
a dielectric layer covering a surface of the BAW resonator,
wherein the sandwich further comprises:
  a center area, wherein the bottom electrode, the piezoelectric layer, and the top electrode of the sandwich overlap each other;
  an underlap region surrounding the center area and having a thickness $d_U$ smaller than a thickness $d_C$ of the center area, wherein a thickness of the top electrode is reduced in the underlap region relative to the center area by about 15 nm; and
  a frame region surrounding the underlap region and having a thickness $d_F$ greater than $d_C$.

11. The BAW resonator of claim 10, wherein the frame region is formed by a dielectric interlayer arranged between the top electrode and the piezoelectric layer.

12. The BAW resonator of claim 10, wherein the thickness $d_U$ being smaller than the thickness $d_C$ is mainly due to a reduced thickness of one or more of the bottom electrode or the top electrode.

13. The BAW resonator of claim 10, wherein one of the bottom electrode and the top electrode comprises a first sub-layer of aluminum copper and a second sub-layer of tungsten, and wherein the thickness of one of the first sub-layer or the second sub-layer is reduced in the underlap region.

14. The BAW resonator of claim 10, wherein the dielectric layer has a uniform thickness over a total surface of the BAW resonator.

15. The BAW resonator of claim 10, wherein the BAW resonator is arranged in ladder type circuit of series resonators and shunt resonators, each series and shunt resonator being embodied as the BAW resonator, and wherein the dielectric layer is a trimming layer.

16. The BAW resonator of claim 10, wherein the dielectric layer is a trimming layer formed of silicon nitride having a uniform thickness of about 60 nm.

17. The BAW resonator of claim 10, wherein the underlap region has a width of about 0.2 µm to 8.0 µm.

* * * * *